United States Patent
Kai et al.

(10) Patent No.: US 6,608,362 B1
(45) Date of Patent: Aug. 19, 2003

(54) METHOD AND DEVICE FOR REDUCING CAPACITIVE AND MAGNETIC EFFECTS FROM A SUBSTRATE BY USING A SCHOTTKY DIODE UNDER PASSIVE COMPONENTS

(75) Inventors: Shao Kai, Shanghai (CN); Sanford Chu, Singapore (SG); Chit Hwei Ng, Singapore (SG); Jia Zhen Zheng, Singapore (SG); Sia Choon Beng, Singapore (SG); Chew Kok Wai, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/224,150

(22) Filed: Aug. 20, 2002

(51) Int. Cl.[7] .......................................... H01L 21/8234
(52) U.S. Cl. ..................... 257/528; 257/471; 257/453; 438/237; 438/238
(58) Field of Search ................. 257/280–288, 257/449–456, 471–481, 528–543; 438/237–238, 381

(56) References Cited

U.S. PATENT DOCUMENTS

| 4,577,213 A |   | 3/1986  | Bauhahn ...................... 357/69   |
|-------------|---|---------|----------------------------------------|
| 4,922,317 A | * | 5/1990  | Mihara ........................ 257/372 |
| 5,268,315 A |   | 12/1993 | Prasad et al. ................. 437/31  |
| 5,370,766 A |   | 12/1994 | Desaigoudar et al. ........ 156/643     |
| 5,445,985 A |   | 8/1995  | Calviello et al. ............. 437/51   |
| 5,450,263 A |   | 9/1995  | Desaigoudar et al. ........ 360/110     |
| 6,100,770 A |   | 8/2000  | Litwin et al. .......... 331/117 FE     |
| 6,144,066 A | * | 11/2000 | Claverie ..................... 257/328  |

* cited by examiner

Primary Examiner—Jey Tsai
(74) Attorney, Agent, or Firm—George O. Saile; Rosemary L.S. Pike

(57) ABSTRACT

A method of fabricating high quality passive components having reduced capacitive and magnetic effects by using a Schottky diode underlying the passive components in the manufacture of integrated circuits is described. A Schottky diode is formed completely covering an active area where passive devices are to be formed. The Schottky diode is covered with a dielectric layer. Passive components are formed overlying the dielectric layer wherein the Schottky diode reduces substrate noise resulting in high quality of the passive components.

17 Claims, 3 Drawing Sheets

METHOD AND DEVICE FOR REDUCING CAPACITIVE AND MAGNETIC EFFECTS FROM A SUBSTRATE BY USING A SCHOTTKY DIODE UNDER PASSIVE COMPONENTS

BACKGROUND OF THE INVENTION (1) Field of the Invention

The invention relates to a method of forming an integrated circuit, and more particularly, to a method of reducing noise by forming a Schottky diode underlying passive components in the manufacture of integrated circuits.

(2) Description of the Prior Art

In the manufacture of integrated circuits, circuits such as radio frequency (RF) circuits have many passive components; for example, inductors and metal-insulator-metal (MIM) capacitors. These passive components require a high quality factor, but they often suffer from noise originating from the substrate. The magnetic effect from the substrate to an inductor is one major source of noise which degrades the inductor's performance. Many process engineering procedures have been used to protect inductors and other components from noise, but these processes are usually quite complicated.

U.S. Pat. Nos. 5,445,985 to Calviello et al, 5,268,315 to Prasad et al, and 5,450,263 and 5,370,766, both to Desai-goudar et al show methods of forming inductors and Schottky diodes. U.S. Pat. No. 4,577,213 to Bauhahn shows a Schottky barrier beam lead diode. U.S. Pat. No. 6,100,770 to Litwin et al teaches a method of forming a high quality varactor.

SUMMARY OF THE INVENTION

A principal object of the present invention is to provide an effective and very manufacturable method of forming high quality passive components in the fabrication of integrated circuit devices.

Another object of the invention is to provide a method of fabricating passive components having reduced noise in the manufacture of integrated circuits.

Yet another object of the invention is to provide a method of fabricating high quality passive components having reduced capacitive and magnetic effect in the manufacture of integrated circuits.

A further object is to provide a method of fabricating high quality passive components having reduced capacitive and magnetic effect by using a Schottky diode underlying the passive components.

A still further object is to provide a method of fabricating a high quality inductor having reduced magnetic effect from the substrate by using a Schottky diode underlying the inductor.

A yet further object is to provide a method of fabricating a high quality capacitor having reduced capacitive effect from the substrate by using a Schottky diode underlying the capacitor.

Yet another object of the invention is to provide an integrated circuit device with high quality passive components having reduced capacitive and magnetic effect in the manufacture of integrated circuits.

A further object is to provide an integrated circuit device with high quality passive components having reduced capacitive and magnetic effect because of the presence of a Schottky diode underlying the passive components.

A still further object is to provide an integrated circuit device with a high quality inductor having reduced magnetic effect from the substrate because of the presence of a Schottky diode underlying the inductor.

A yet further object is to provide an integrated circuit device with a high quality capacitor having reduced capacitive effect from the substrate because of the presence of a Schottky diode underlying the capacitor.

In accordance with the objects of this invention a method of fabricating high quality passive components having reduced capacitive and magnetic effects by using a Schottky diode underlying the passive components in the manufacture of integrated circuits is achieved. A Schottky diode is formed completely covering the active area where passive components will be formed. The Schottky diode is covered with a dielectric layer. Passive components are formed overlying the dielectric layer wherein the Schottky diode reduces substrate noise resulting in high quality of the passive components.

Also in accordance with the objects of the invention, an integrated circuit device with high quality passive components having reduced capacitive and magnetic effect because of the presence of a Schottky diode underlying the passive components is achieved. A Schottky diode completely covers an active area of a substrate. A dielectric layer overlies the Schottky diode. Passive components overlie the dielectric layer. The Schottky diode reduces substrate noise resulting in high quality of the passive components.

BRIEF DESCRIPTION OF THE DRAWINGS

In the accompanying drawings forming a material part of this description, there is shown.

DESCRIPTION OF THE PREFERRED EMBODIMENTS

The process of the present invention forms a Schottky diode using a salicide process to form a reverse diode which will protect overlying components from substrate noise. The silicide film also acts as a metal shield to reduce substrate magnetic noise.

Figure 1:
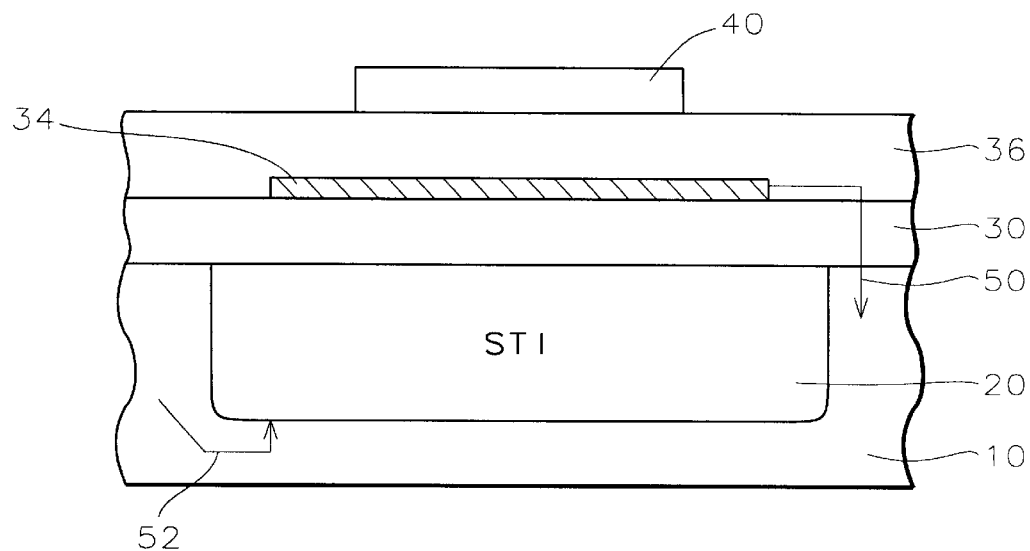
FIG. 1 schematically illustrates in cross-sectional representation a passive device of the prior art.

FIG. 1 illustrates a typical integrated circuit device of the prior art. Semiconductor substrate 10 is illustrated, preferably formed of monocrystalline silicon. A shallow trench isolation region is covered by an N-well 20. A metal layer 34, usually copper or aluminum-copper, is formed over a dielectric layer 30. Passive component 40 has been formed overlying dielectric layer 36. The passive component may be an inductor or a capacitor such as a MIM capacitor. 50 shows the metal shield 34 is connected to ground. 52 indicates noise from the substrate. The noise, in wave-form, can propagate into the N-well region and can be absorbed by the metal shield 34. Since the metal shield 34 is very close to the passive component, it does not protect the passive component from noise.

The process of the present invention reduces noise from the substrate in the form of magnetic or capacitive effects by forming a Schottky diode underlying the passive components.

Figure 2:
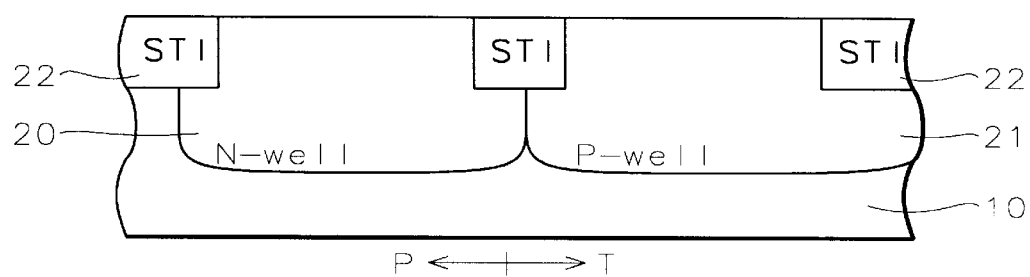
FIGS. 2 through 4 schematically illustrate in cross-sectional representation a preferred embodiment of the process of the present invention.

Referring now more particularly to FIG. 2, there is shown a partially completed integrated circuit device. Shallow trench isolation (STI) regions 22 have been formed within the substrate. Active region P where passive devices will be formed lies between two of the STI regions shown. Active region T where transistor devices will be formed lies between another two STI regions. An N-well 20 is formed in the semiconductor substrate 10 in the passive region P. For example, a P-well 21 may be formed in the T region.

Figure 3:
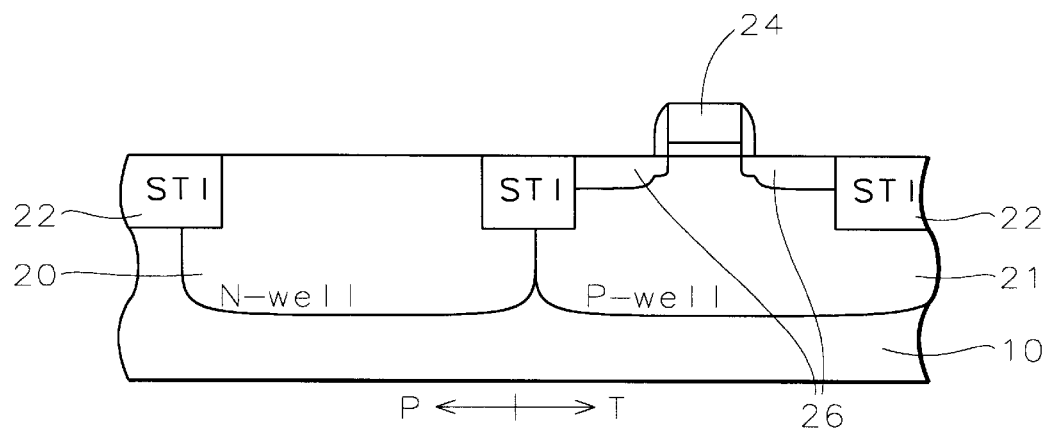

Referring now to FIG. 3, semiconductor device structures are formed in and on the substrate in the transistor region T. For example, gate electrode 24 is fabricated overlying a gate oxide layer in the active region. Lightly doped source and drain regions and heavily doped source and drain regions 26 are formed within the substrate adjacent to the gate, as shown.

Figure 4:
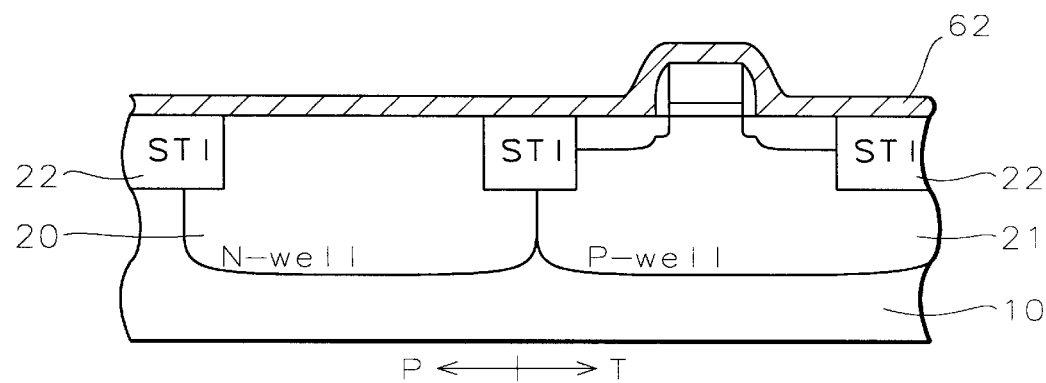
Figure 5:
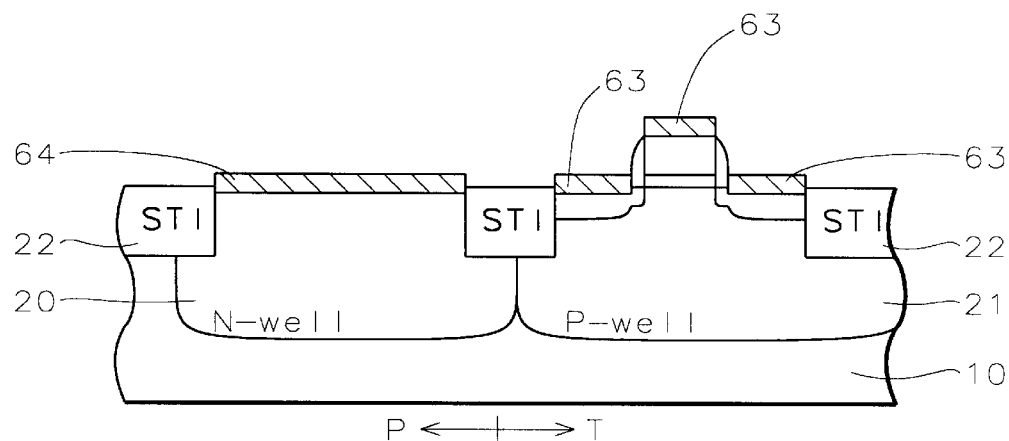
FIG. 5 is a circuit diagram of the P/N Schottky diode of the preset invention.

Referring now to FIG. 4, the Schottky diode protective device of the present invention is to be fabricated. The contact structure of a metal to a lightly doped silicon is known as a Schottky diode. A metal layer 62 is deposited over the semiconductor substrate in the passive region P and over the device structures in the transistor region T. The metal layer may be cobalt or cobalt and titanium. The substrate is annealed, for example using a rapid thermal anneal, wherein the silicon reacts with the overlying metal layer to form a metal salicide layer 63 in the transistor region T on the gate electrode and on the source/drain regions for Ohmic contact and to form the Schottky diode 64 in the passive region P. The unreacted metal 62 is removed, resulting in FIG. 5.

Figure 6:
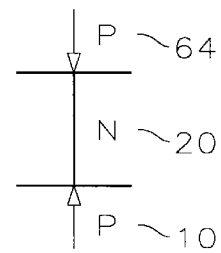
FIGS. 6 and 7 schematically illustrate in cross-sectional representation a preferred embodiment of the present invention.

FIG. 6 is a circuit diagram of the P/N Schottky diode 64. This back-to-back diode will block the substrate noise.

Figure 7:
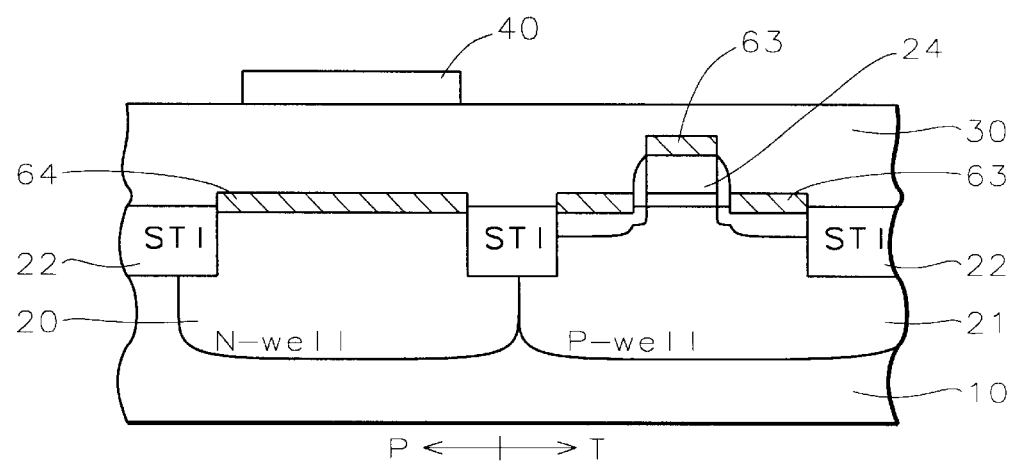

Processing continues now as conventional to form a passivated interlevel dielectric layer (ILD) 30 over the salicided devices 63 and the Schottky diode 64, as illustrated in FIG. 7. Passive component 40 is fabricated as shown in FIG. 7. For example, component 40 may be an inductor. A high quality material such as copper is deposited over the surface of the ILD layer 30. The copper layer is patterned to form the inductor 40. For example, the inductor may have a spiral shape or any other desired shape.

In another example, component 40 may be a capacitor such as a MIM capacitor. In this case, a capacitor stack may be formed comprising a first metal layer, a capacitor dielectric layer overlying the first metal layer, and a second metal layer overlying the capacitor dielectric layer. The stack is patterned to form MIM capacitor 40.

The Schottky diode 64 reduces the magnetic effect of the substrate. That is, the noise from the substrate 52 is absorbed by the Schottky diode so that it does not travel to the passive component 40. The Schottky diode of the present invention provides a reverse diode to protect the components from substrate noise. The silicide film serves as a metal shield to further reduce substrate noise.

The process of the present invention provides high quality passive components such as inductors and capacitors. The Schottky diode of the present invention underlying the passive components provides noise protection thus reducing capacitive and magnetic effects from the substrate.

While the invention has been particularly shown and described with reference to the preferred embodiments thereof, it will be understood by those skilled in the art that various changes in form and details may be made without departing from the spirit and scope of the invention.

What is claimed is:

1. A method of forming an integrated circuit device having high quality passive components comprising:

providing an active area of a silicon substrate where said passive components are to be fabricated;

forming a Schottky diode completely covering said active area;

covering said Schottky diode with a dielectric layer; and forming said passive components overlying said dielectric layer wherein said Schottky diode reduces substrate noise resulting in high quality of said passive components in the fabrication of said integrated circuit device.

2. The method according to claim 1 wherein said step of forming said Schottky diode comprises:

depositing a metal layer overlying said silicon substrate; and annealing said metal layer wherein said metal layer reacts with said silicon substrate to form a metal silicide layer overlying said silicon substrate.

3. The method according to claim 2 wherein said metal layer is chosen from the group consisting of: cobalt and cobalt/titanium.

4. The method according to claim 1 wherein said passive components are chosen from the group consisting of:

inductors and MIM capacitors.

5. The method according to claim 1 wherein said substrate noise comprises magnetic effects.

6. The method according to claim 1 wherein said substrate noise comprises capacitive effects.

7. A method of forming an integrated circuit device having high quality passive components comprising:

providing an active area of a silicon substrate where said passive components are to be fabricated;

depositing a metal layer overlying said silicon substrate;

annealing said metal layer wherein said metal layer reacts with said silicon substrate to form a metal silicide layer overlying said silicon substrate wherein said silicon substrate and overlying said metal silicide layer together comprise a Schottky diode completely covering said active area;

covering said Schottky diode with a dielectric layer; and forming said passive components overlying said passivation layer wherein said Schottky diode reduces substrate noise resulting in high quality of said passive components in the fabrication of said integrated circuit device.

8. The method according to claim 7 wherein said metal layer is chosen from the group consisting of: cobalt and cobalt/titanium.

9. The method according to claim 7 wherein said passive components are chosen from the group consisting of:

inductors and MIM capacitors.

10. The method according to claim 7 wherein said substrate noise comprises magnetic effects.

11. The method according to claim 7 wherein said substrate noise comprises capacitive effects.

12. A integrated circuit device having high quality passive components comprising:

a Schottky diode completely covering an active area of a silicon substrate;

a dielectric layer overlying said Schottky diode; and said passive components overlying said dielectric layer wherein said Schottky diode reduces substrate noise resulting in high quality of said passive components.

13. The device according to claim 12 wherein said Schottky diode comprises a layer of metal silicide overlying said silicon substrate.

14. The device according to claim 13 wherein said metal silicide is chosen from the group consisting of:

cobalt silicide and cobalt silicide/titanium silicide.

15. The device according to claim 12 wherein said passive components are chosen from the group consisting of: inductors and MIM capacitors.

16. The device according to claim 12 wherein said substrate noise comprises magnetic effects.

17. The device according to claim 12 wherein said substrate noise comprises capacitive effects.

* * * * *